(12) United States Patent
Marty et al.

(10) Patent No.: US 6,902,970 B2
(45) Date of Patent: Jun. 7, 2005

(54) INTEGRATED CIRCUIT INCLUDING, AND FABRICATION METHOD FOR PRODUCING, BIPOLAR AND MOSFET TRANSISTORS

(75) Inventors: Michel Marty, Varces (FR); Alain Chantre, Seyssins (FR)

(73) Assignee: STMicroelectronics S.A. (FR)

( * ) Notice: Subject to any disclaimer, the term of this patent is extended or adjusted under 35 U.S.C. 154(b) by 79 days.

(21) Appl. No.: 10/352,376

(22) Filed: Jan. 27, 2003

(65) Prior Publication Data

US 2003/0186500 A1 Oct. 2, 2003

(30) Foreign Application Priority Data

Feb. 4, 2002 (FR) .............................. 02 01305

(51) Int. Cl.$^7$ ................ H01L 21/8238; H01L 21/8249

(52) U.S. Cl. ...................... 438/202; 438/234

(58) Field of Search ................ 438/202, 234, 438/197, 800

(56) References Cited

U.S. PATENT DOCUMENTS

| 5,227,339 A | * | 7/1993 | Kishii | ................ | 438/459 |
| 5,523,606 A | | 6/1996 | Yamazaki | ................ | 257/370 |
| 2002/0013025 A1 | | 1/2002 | Wylie | ................ | 438/235 |

FOREIGN PATENT DOCUMENTS

| EP | 1 037 284 A2 | 9/2000 |
| JP | 10 178117 | 6/1998 |
| JP | 2001 007232 | 1/2001 |

OTHER PUBLICATIONS

French Search Report, FA 614936/FR 0201305, dated Oct. 2002.

Osten, et al., "Dopant diffusion control by adding carbon into Si and SiGe: principles and device application"; *Materials Science and Engineering B, Elsevier Sequoia*; vol. 87 No. 3, pp. 262–270, dated Dec. 19, 2001.

Dunn, et al., "Trends in Silicon Germanium BiCMOS Integration and Reliability"; *2000 IEEE International Reliability Physics Symposium Proceedings*, 38th Annual, San Jose, CA., Apr. 10–13, 2000 and New York, New York, pp. 237–242, XP001077899.

St. Onge, et al., "A 0.24 μm SiGe BiCMOS Mixed–Signal RF Production Technology Featuring a 47 Ghz $f_t$ HBT and 0.18 μm $L_{eff}$ CMOS"; *Bipolar/BiCOMS Circuits and Technology Meeting, 1999, Proceedings of the 1999 Minneapolis, MN, Sep. 1999, Piscataway, NJ, IEEE*, Sep. 26, 1999; pp. 117–120; XP010359517.

Hashimoto, et al., A 73 Ghz $f_t$ 0.18 μm RF–SiGe BiCOMOS Technology considering Thermal Budget Trade–off and with reduced Boron–spike Effect on HBT Characteristics; *International Electron Devices Meeting 2000, IEDM. Technocal Digest, San Francisco, CA and New York, NY, IEEE*, Dec. 10–13, 2000; pp. 149–152, XP 000988821.

* cited by examiner

*Primary Examiner*—Craig A. Thompson
(74) *Attorney, Agent, or Firm*—Jenkens & Gilchrist, PC

(57) ABSTRACT

Production of an insulated-gate field-effect transistor is begun and interrupted at an uncompleted point. Then, a bipolar transistor is almost completely produced. At that point, a return is made to the production of the insulated-gate field-effect transistor. Lastly, a finishing step common to both transistors and including common thermal annealing and common siliciding is performed.

21 Claims, 12 Drawing Sheets

INTEGRATED CIRCUIT INCLUDING, AND FABRICATION METHOD FOR PRODUCING, BIPOLAR AND MOSFET TRANSISTORS

CROSS REFERENCE

The present application claims foreign priority from French application for patent No. 0201305 filed Feb. 4, 2002, the disclosure of which is hereby incorporated by reference.

BACKGROUND OF THE INVENTION

1. Technical Field of the Invention

The present invention relates to integrated circuits and more particularly to the production of bipolar transistors and insulated-gate field-effect transistors (MOSFET) in a semiconductor bulk (substrate). The invention finds an advantageous application in bipolar and BiCMOS technologies used in radio frequency applications.

2. Description of Related Art

A number of needs exist in the art with respect to the fabrication of bipolar transistors and insulated-gate field-effect transistors (MOSFET) in a semiconductor bulk (substrate). For example, it would be advantageous if the production of MOS transistors and bipolar transistors could be accomplished without any interference between the two processes used. Additionally, benefits would accrue if the bipolar transistor structure was compatible with the bipolar and BiCMOS technologies, and further if that structure was usable in radio frequency applications. A need also exists for reproducible structures possessing sub-micron emitters (for example, with a dimension of the order of 0.1 to 0.3 microns). It would also be advantageous if the bipolar transistor could be produced without emitter doping compensation. Lastly, a need exists for a process/structure which possesses minimized emitter-base distance such that base resistance and base/collector capacitance are reduced, thus allowing for an improvement in frequency performance.

The present invention address many, if not all, of the foregoing needs.

SUMMARY OF THE INVENTION

The present invention proposes a method of fabricating an integrated circuit including at least one bipolar transistor and at least one insulated-gate field-effect transistor (MOS) within the same semiconductor bulk.

According to a general feature of the invention, production of the MOS transistor is begun, after which the bipolar transistor is almost completely produced before returning to the production of the MOS transistor, followed by a finishing step common to both transistors and including common thermal annealing and common siliciding steps. MOS transistors have become highly sensitive to thermal balances, which can cause diffusion of dopants. Terminating the production of an MOS transistor after virtually complete production of the bipolar transistor (apart from annealing and siliciding) means that the heat treatments used in the fabrication of the bipolar transistor are no longer a problem.

In addition, an agent blocking the diffusion of dopants during heat treatment is advantageously added to the intrinsic and extrinsic base of the bipolar transistor. This agent can be carbon, for example. This minimizes the risk of unwanted diffusion of dopants in the bipolar transistor during heat treatment used in the production of the MOS transistor.

In an embodiment of the invention that is particularly suitable for radio frequency applications, the intrinsic and extrinsic base of the bipolar transistor is a heterojunction base, for example a silicon-germanium base, including carbon.

In addition, in one embodiment of the invention, the emitter, the extrinsic base, the silicidation areas of the bipolar transistor, and, where applicable, an implanted collector (SIC) region under the emitter, are produced in such a fashion that they are auto-aligned on the intrinsic base, which is itself obtained by non-selective epitaxial growth.

This auto-alignment reduces the base/emitter distance. This auto-alignment also reduces the base input resistance. Furthermore, a thinner emitter reduces the electron transit time in the emitter. The emitter window is moreover preferably defined lithographically, as a result of which perfectly reducible sub-micron emitters can be obtained.

In one embodiment of the invention, the method includes:

a first phase including producing isolating areas in the semiconductor bulk, forming a gate material layer for the future MOS transistor, gate implantation and annealing, and delimiting the bipolar transistor production area with etching of the gate material layer, a second phase including virtually all of the steps of producing the bipolar transistor, a third phase including further steps of producing the MOS transistor, and a final phase including said finishing step.

For example, the second phase thus includes producing the intrinsic base and the extrinsic base of the bipolar transistor and the emitter and the third phase includes etching the gate material layer to define the gate of the MOS transistor and forming the source and drain regions.

In one embodiment of the invention, producing the emitter includes forming a sacrificial emitter flanked by isolating spacers, the combination of the sacrificial emitter and the isolating spacers being isolated in an isolating layer, for example a thick layer of TEOS (tetraethylorthosilicate) oxide.

Producing the emitter further includes removing the sacrificial emitter, final formation of the emitter in the cavity produced by removing the sacrificial emitter, and removing said thick isolating layer.

Using a sacrificial emitter avoids the need for final emitter doping compensation when implanting the extrinsic base.

The sacrificial emitter is formed on top of the intrinsic base of the bipolar transistor and the top surface of the sacrificial emitter advantageously extends higher than the top surface of the stack of layers in the MOS transistor production area and including said gate material layer. This avoids damaging the gate material layer during mechanochemical polishing steps that are advantageously employed in the method according to the invention to form the emitter and which further include detection of interfaces between two different materials.

The invention also provides an integrated circuit obtained by the method defined above.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 1:
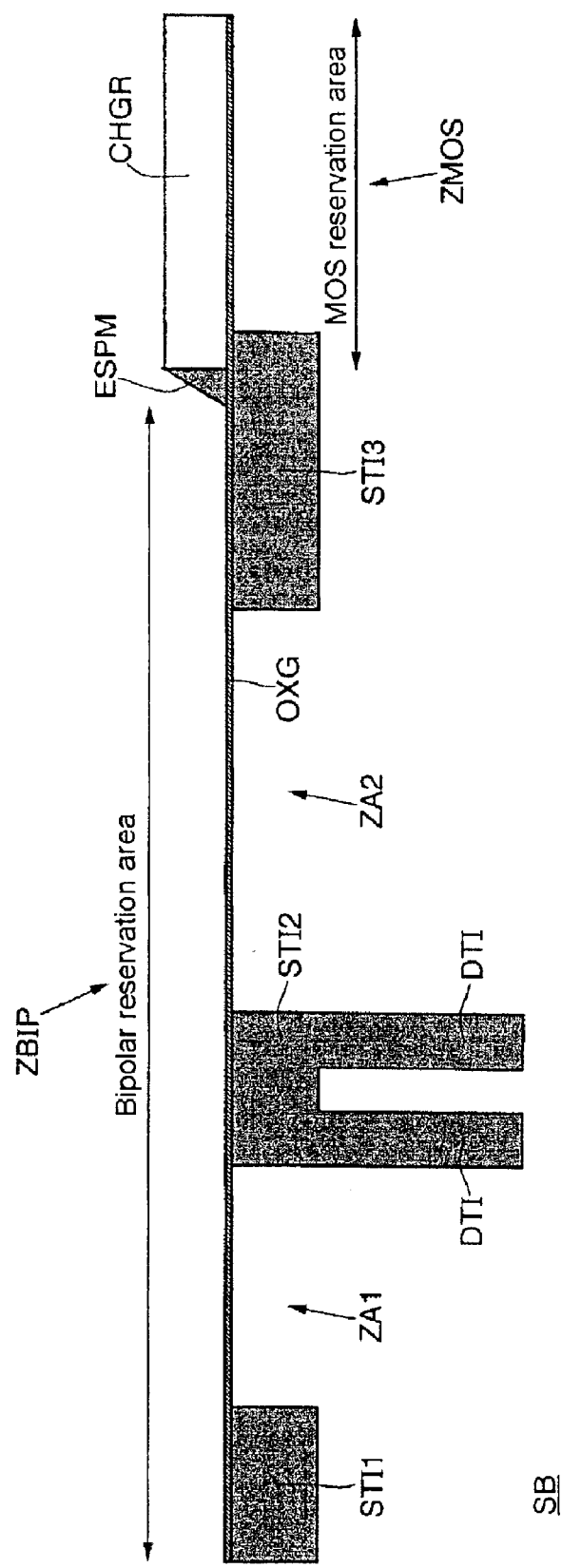
FIGS. 1 to 12 show diagrammatically the main steps of one embodiment of a method according to the invention.

In FIG. 1, the reference SB designates a semiconductor (for example silicon) bulk (substrate) within which is to be produced an integrated circuit including N-channel and/or P-channel type MOS transistors and bipolar transistors.

Before producing the bipolar transistors and the MOS transistors as such, isolating areas are produced in the semiconductor bulk SB in a conventional way known to the person skilled in the art. FIG. 1 shows, by way of example, a shallow trench isolating area STI2 extended by deep trenches DTI. The area STI2 separates an active area ZA1 in which a bipolar transistor with a narrow emitter is to be produced from a wider active area ZA2 in which a bipolar transistor with a wide emitter is to be produced. The isolating area STI1, which is also a shallow trench, separates the active area ZA1 from the extrinsic collector area, not shown here to simplify the drawing. Similarly, for simplicity, the middle part of FIG. 1 shows only the active area ZA2, without showing a shallow trench separating this active area from the extrinsic collector of the bipolar transistor with the wide emitter. The isolating area STI3 also marks the boundary with the reservation area ZMOS.

A silicon dioxide layer OXG is first formed on the top surface of the substrate, for example by thermal growth in a furnace at a temperature of the order of 900 to 950°. The layer OXG forms the gate oxide of the future MOS transistor.

A layer of gate material, for example polysilicon, is then deposited over the whole of the surface of the oxide layer OXG, to a thickness of the order of 150 nm, for example.

This is followed by preliminary doping of the gate material by implantation followed by thermal annealing, which is conventional and known in the art.

Conventional lithographic techniques are then used to reserve an area ZBIP in which bipolar transistors are to be produced and consequently to reserve an area ZMOS in which MOS transistors are to be produced.

The gate material layer is then etched in the area ZBIP, leaving only the gate material layer CHGR in the area ZMOS.

A TEOS oxide layer is then deposited on the structure obtained in the above manner, for example to a thickness of the order of 80 nm, and is then etched in a conventional way known to the person skilled in the art, stopping at the layer CHGR, to form lateral isolating regions (spacers) ESPM.

Thus, at this stage of the process, the production of the gate of the future MOS transistors has begun, and the next step is the virtually complete production of the bipolar transistors.

An isolating stack is deposited over the whole of the wafer, comprising a first oxide layer OX1, for example a layer of TEOS oxide, on top of which is a silicon nitride layer N1, on top of which is a second oxide layer OX2, for example also a layer of TEOS oxide. The thickness of each of these three layers is of the order of 20 nm, for example.

A "buffer layer" PBB of polysilicon is then deposited on top of the above stack of isolating layers, for example to a thickness of 50 nm, to ensure uniform epitaxial growth of the base of the bipolar transistors at a subsequent stage of the process.

Lithographic techniques are then used to define the bipolar active areas ZA1 and ZA2 and the stack of buffer PBB/oxide OX2/nitride N1 layers is then etched in these areas.

The next step is removal of oxide from the active areas ZA1 and ZA2, for example by a wet chemical method. This is followed by non-selective epitaxial growth of a stack of layers to form the base BS of the bipolar transistors.

Thus, the base BS is formed of a layer of $SI_xGE_{1-x}C_y$ generally comprising from 10% to 40% germanium and less than 1% carbon, for example of the order of 0.05% carbon, this silicon-germanium-carbon layer being encapsulated between two layers of silicon. The base can be doped with boron in situ and has a total thickness of the order of 30 nm.

The next step is lithography of the resulting stack, followed by etching of the stack, stopping at the oxide layer OX2. This produces the structure shown in FIG. 2.

There remains on top of the active area only the stack of layers BS forming the intrinsic base of the bipolar transistor. As shown inside the circle in the right-hand portion of FIG. 2, the stack of layers OX1, N1, OX2, PBB and BS is obtained on top the isolating areas.

On the other hand, the first oxide layer OX1, the nitride layer N1 and a portion of the oxide layer OX2 (which was partially etched when etching the base) remain between the bases BS and between the base BS and the spacer ESPM.

Figure 2:
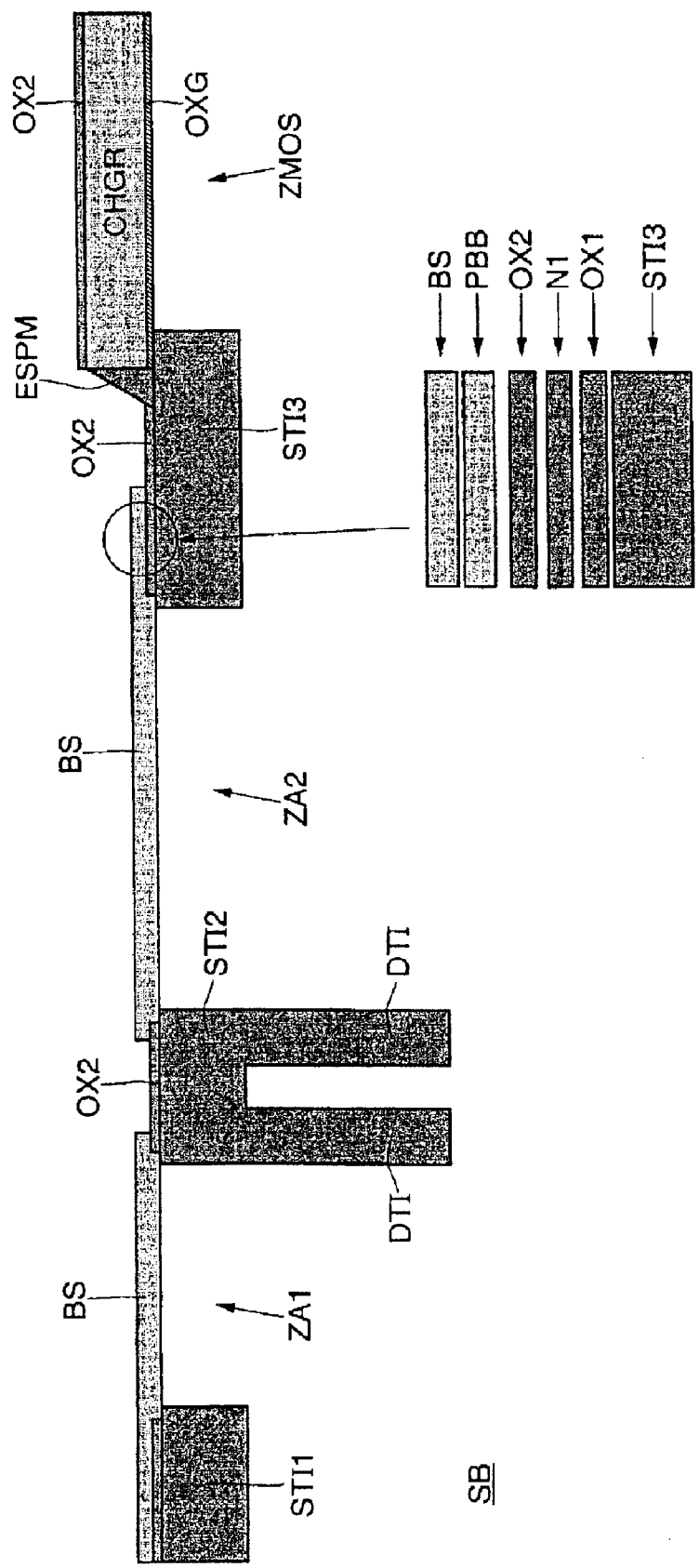
Figure 3:
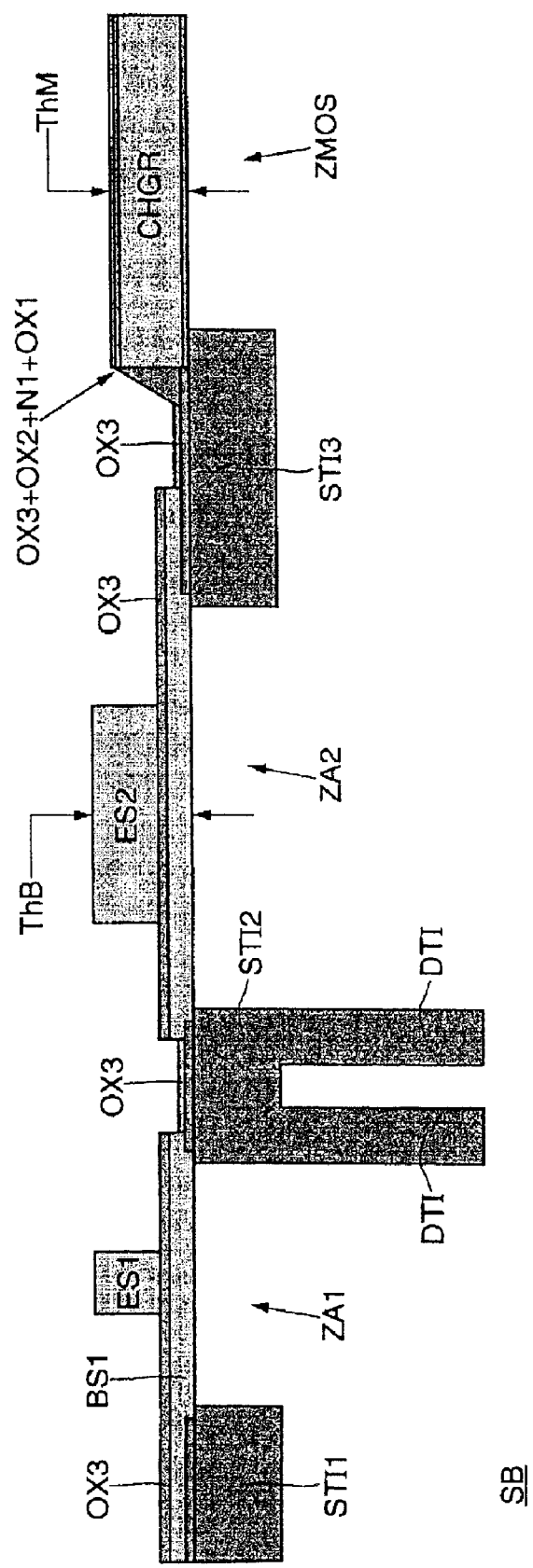

An oxide layer OX3, for example a layer of TEOS oxide, is then deposited on the structure shown in FIG. 2 (see, FIG. 3), to a thickness of the order of 20 nm. A polysilicon layer 250 or 300 nm thick is then deposited. This is followed by a lithography step to define the emitter window of each of the two bipolar transistors that are being produced. The polysilicon layer is then etched, stopping at the oxide OX3, to form two sacrificial emitters ES1 and ES2. These emitters are called "sacrificial emitters" because, as described in more detail later, they define the emitter window on the base of the transistor but are subsequently removed to form the final emitter.

In addition, during the etching operation, the oxide OX3 is lightly etched, to a depth of the order of 5 nm.

After this etching operation, a stack of isolating layers comprising the layer OX1, the nitride layer N1, a residue of the layers OX2 and a residue of the layers OX3 remains on top of the gate material CHGR. The distance ThM between the surface of the bulk SB and the top surface of this stack of isolating layers, which is of the order of 240 nm, is less than the height ThB between the top surface of the substrate and the top surface of the sacrificial emitter ES2 (or ES1), which is of the order of 320 or 370 nm, depending on whether the chosen thickness of the sacrificial polysilicon layer is 250 nm or 300 nm.

As described in more detail later, this height difference avoids damaging the gate material during subsequent mechanochemical polishing steps.

Figure 4:
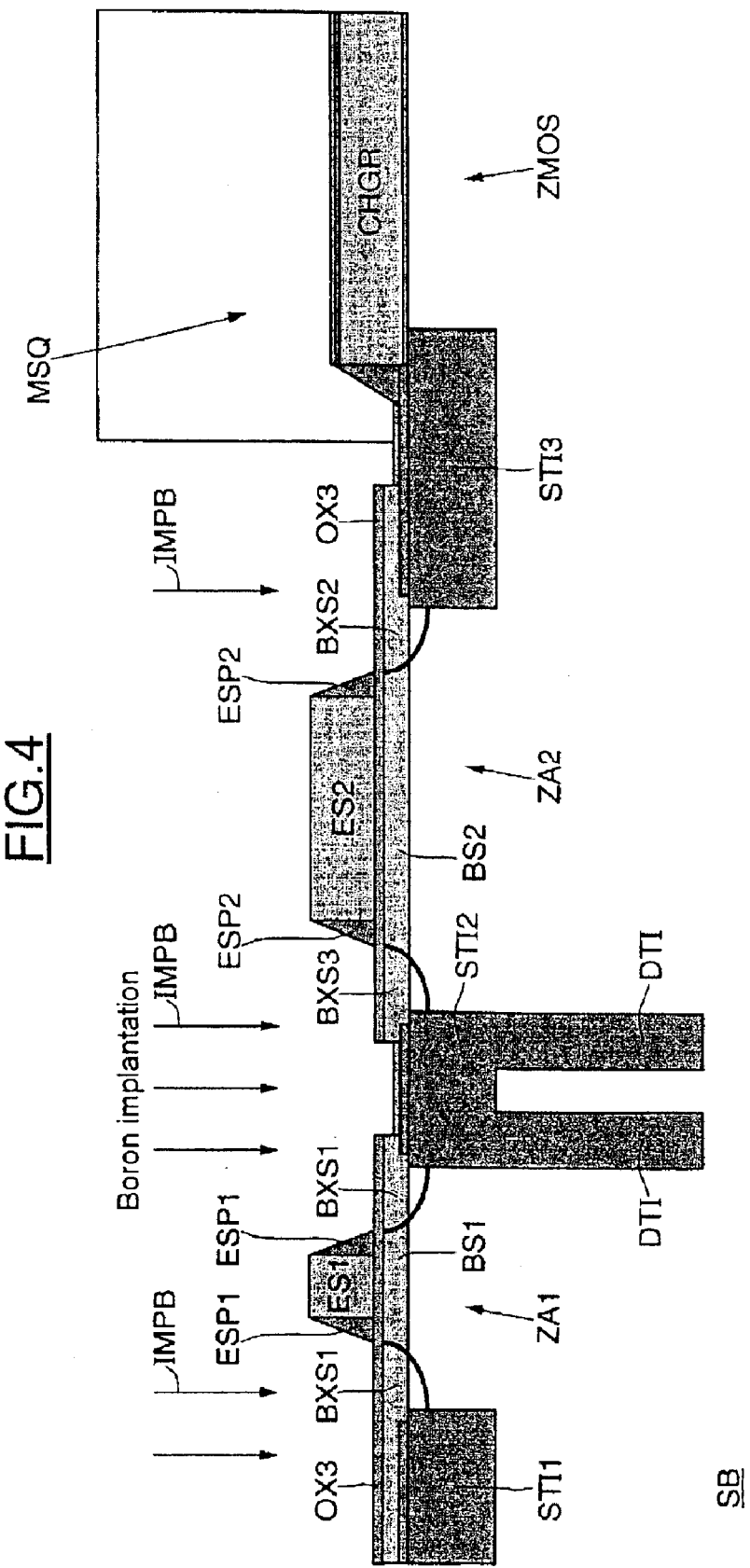

The next step (FIG. 4) is the production of nitride spacers ESP1 and ESP2 respectively flanking the two sacrificial emitters ES1 and ES2. This formation of nitride spacers is conventional and is effected, for example, by depositing a nitride layer having a thickness of 50 nm, for example, onto the structure shown in FIG. 3, and then etching this nitride layer, stopping in the oxide layer OX3.

After covering the area ZMOS with a resin mask MSQ, the extrinsic base BXS1 and BXS2 of the two bipolar transistors is formed by implanting boron IMPB.

It must be noted here that the extrinsic base is auto-aligned with the emitter window as there is no intermediate lithography step between defining the emitter window and implanting the extrinsic base. Moreover, the fact that dopants penetrate into the sacrificial emitter ES1 or ES2 is not important, because these emitters are to be removed subsequently in any case. Consequently, the method according to the invention has the advantage of not involving any emitter doping compensation.

Figure 5:
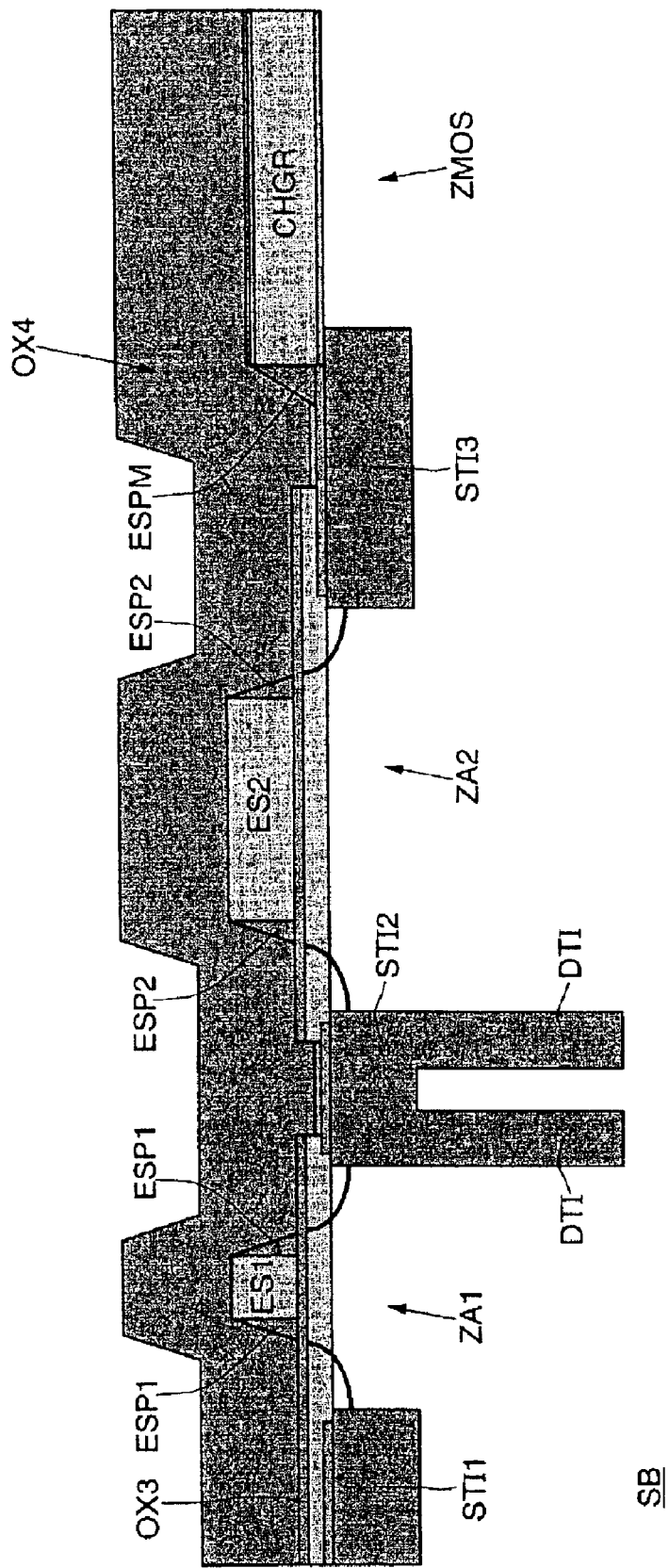

A thick oxide layer OX4 is deposited next, as shown in FIG. 5. This oxide can also be TEOS oxide and its thickness is of the order of approximately 1.5 times the minimum thickness of the sacrificial emitter ES1 or ES2. In this example, this leads to a thickness of the layer OX4 which can vary from approximately 350 to 450 nm.

Figure 6:
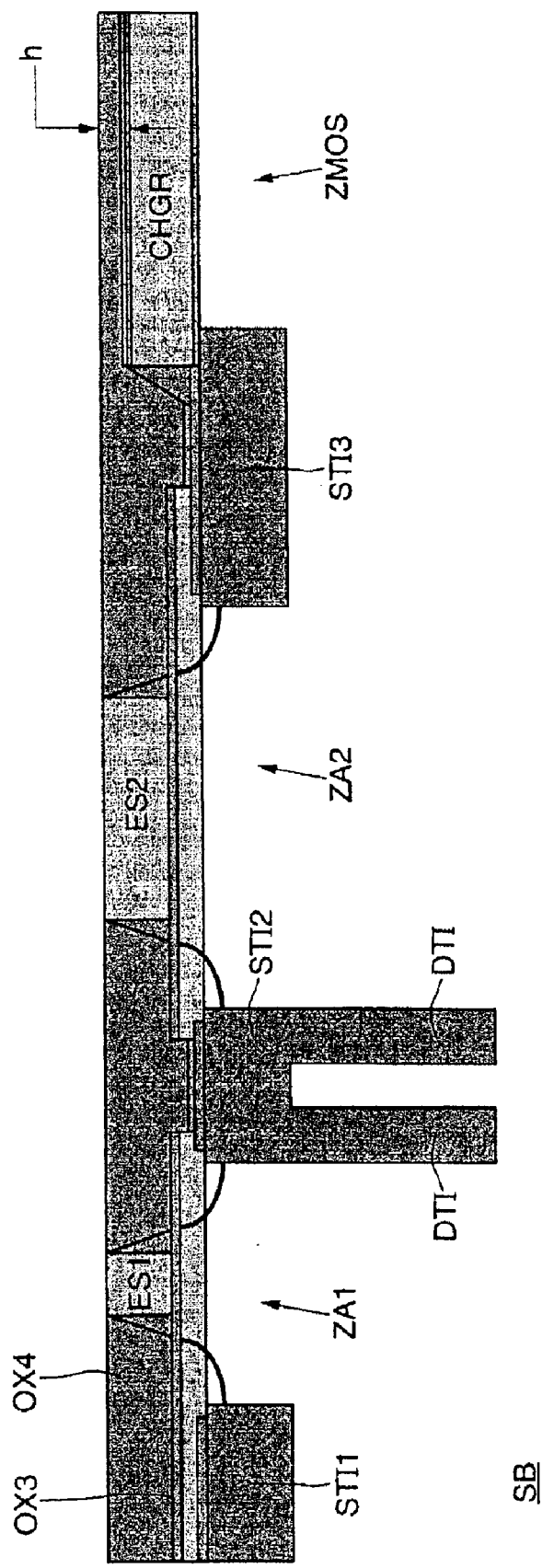

Next is mechanochemical polishing of the oxide layer OX4 (FIG. 6). It must be noted that the abrasive used produces homogeneous mechanochemical polishing by attacking essentially the top portions of the oxide layer OX4. An abrasive based on cerium can be used for this operation, for example HITACHI 8005 or 8102 abrasive.

As shown on the right-hand side in FIG. 6, the mechanochemical polishing step leaves a differential h of oxide on top of the gate material layer CHGR. This differential is of the order of 80 to 130 nm, depending on the thickness of the sacrificial emitter.

Next, the sacrificial emitters ES1 and ES2 are removed, for example by conventional and highly selective isotropic fluorinated chemical etching. At this stage of the process, specific intrinsic collector implantation can be effected (this SIC implantation is well known to the person skilled in the art). The oxide layer OX3 that was underneath the sacrificial polysilicon is then also eliminated, for example by a wet chemical method.

Figure 7:
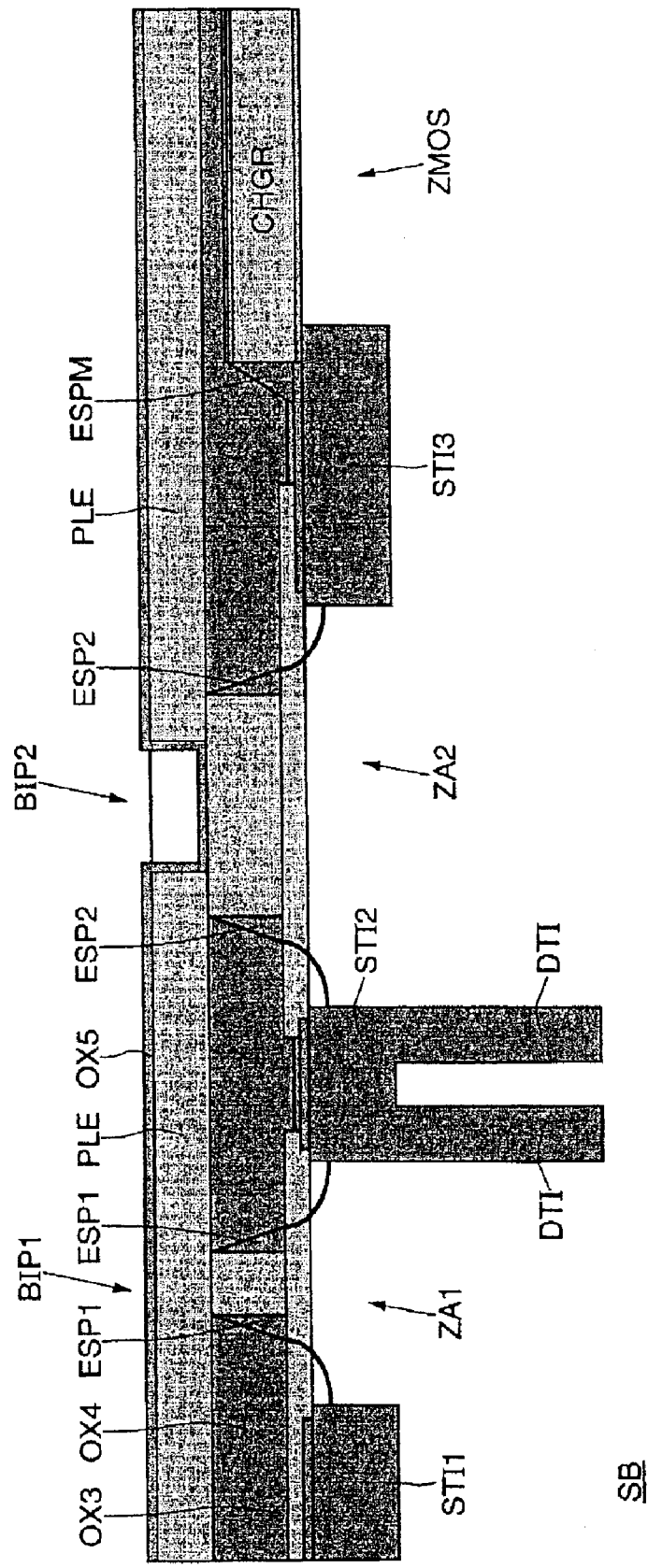

Then, as shown in FIG. 7, a layer of an emitter material, for example polysilicon PLE, is deposited onto the structure obtained as described above, which layer in particular fills the cavities resulting from removing the sacrificial emitters ES1 and ES2 and the underlying portions of the oxide OX3.

Because of the width of the emitter of the future bipolar transistor BIP2, a recess is produced in the polysilicon layer PLE on top of the emitter of transistor BIP2.

The next step is mechanochemical polishing of the polysilicon layer PLE to eliminate the surplus on top of the oxide layer OX4. Before mechanochemical polishing, an oxide layer OX5 with a thickness of the order of 5 nm is deposited to prevent a recess being produced in the emitter of the transistor BIP2.

Figure 8:
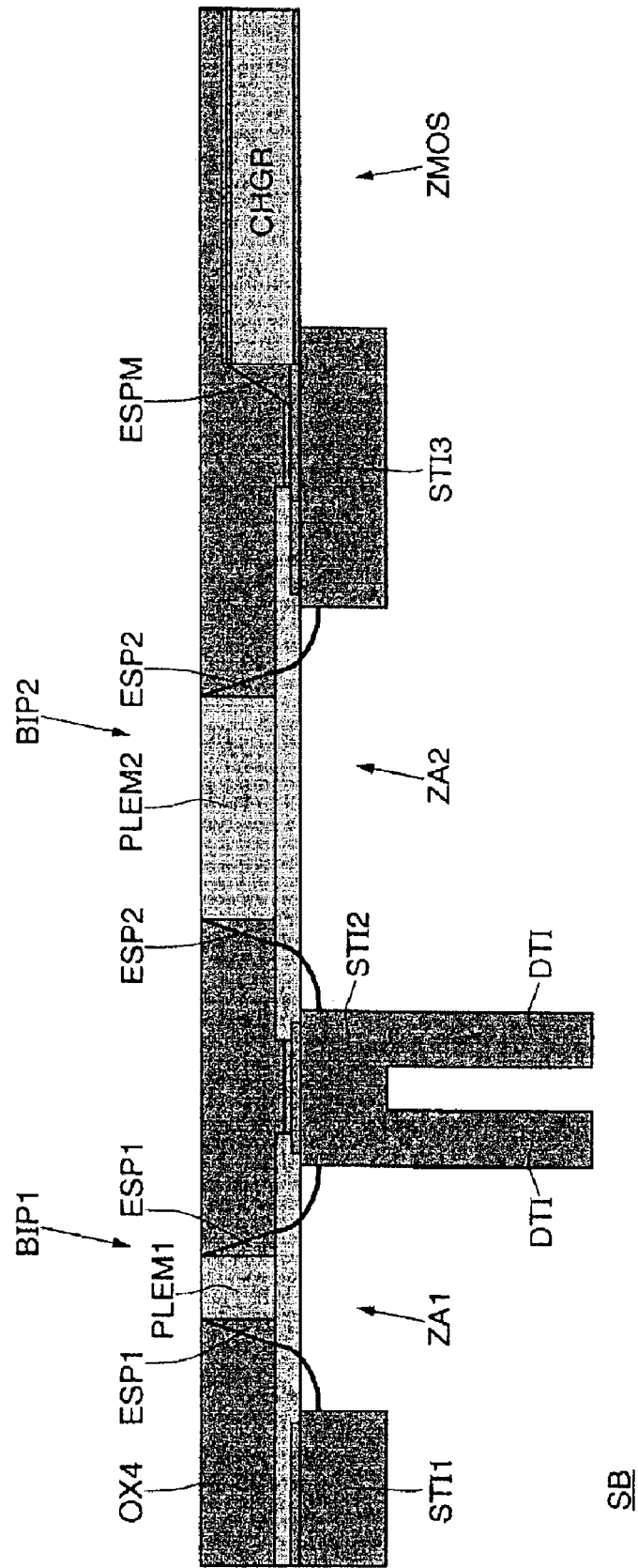

This is followed by mechanochemical polishing, stopping in the oxide OX4. This produces the structure shown in FIG. 8, in which the final emitters of the transistors BIP1 and BIP2 are respectively referenced PLEM1 and PLEM2.

Figure 9:
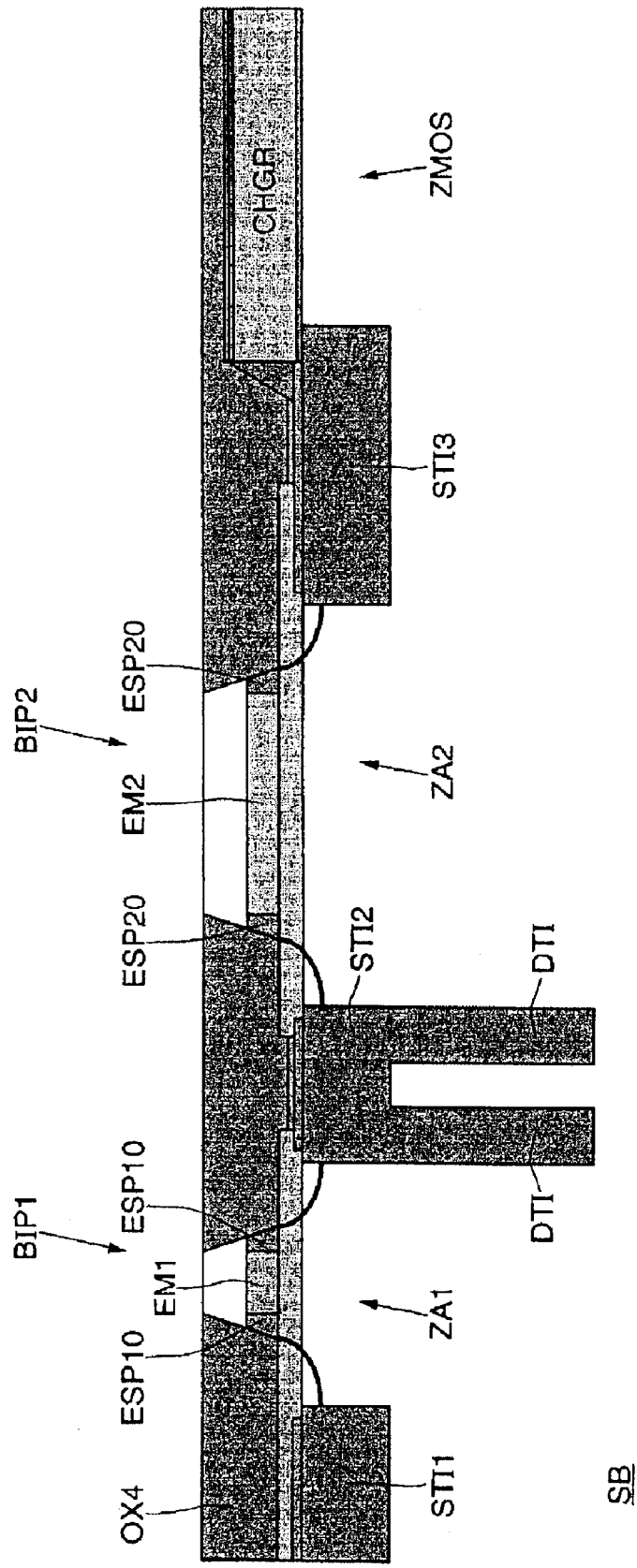

Then, as shown in FIG. 9, the height of the emitters of the bipolar transistors BIP1 and BIP2 is adjusted and the height of the nitride spacers is adjusted to obtain the final emitters EM1 and EM2 flanked by nitride spacers ESP10 and ESP20. This height adjustment is effected by conventional isotropic etching of the emitters and conventional etching of the nitride spacers. The final thickness of the emitters EM1 and EM2 is therefore of the order of 150 nm, for example.

Figure 10:
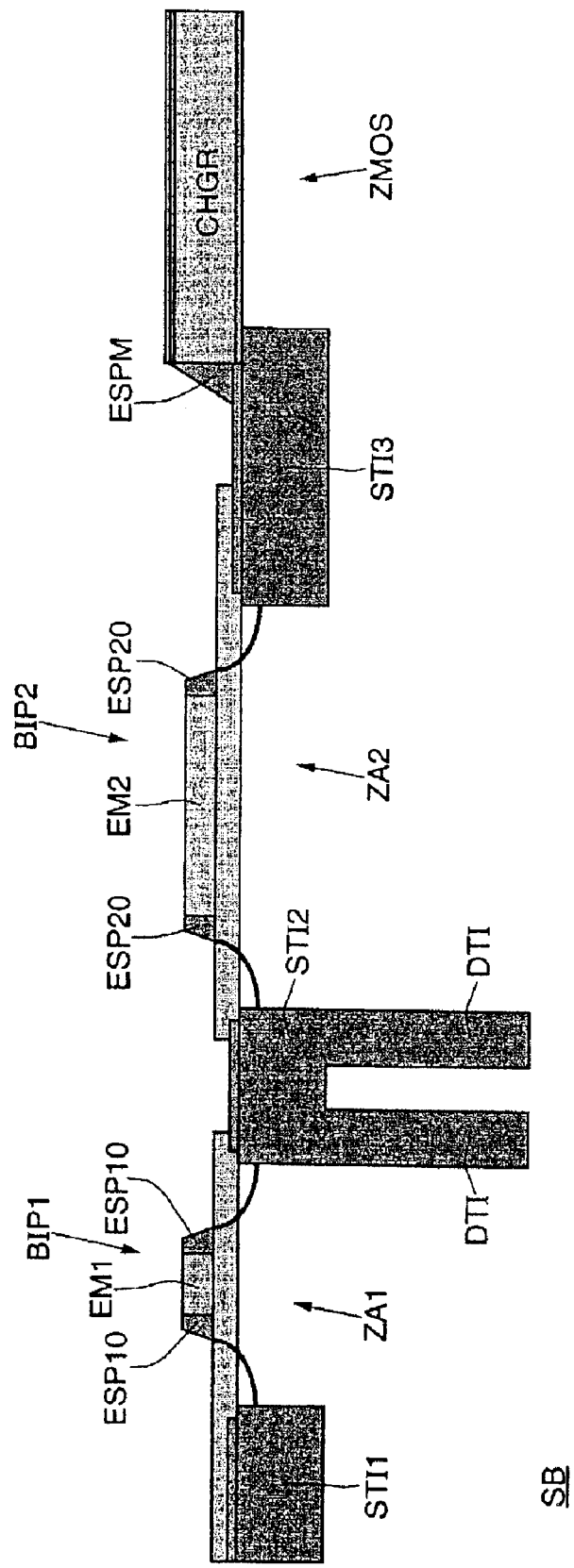

The next step, as shown in FIG. 10, is to eliminate the oxide OX4 by a wet chemical process, stopping at the nitride spacers ESP10 and ESP20 and on the polysilicon.

It would instead be possible at this stage to effect selective epitaxial growth of the extrinsic base and the emitter in order to add an overthickness of silicon, for example a few tens of nanometers, which will be consumed during subsequent siliciding.

Figure 11:
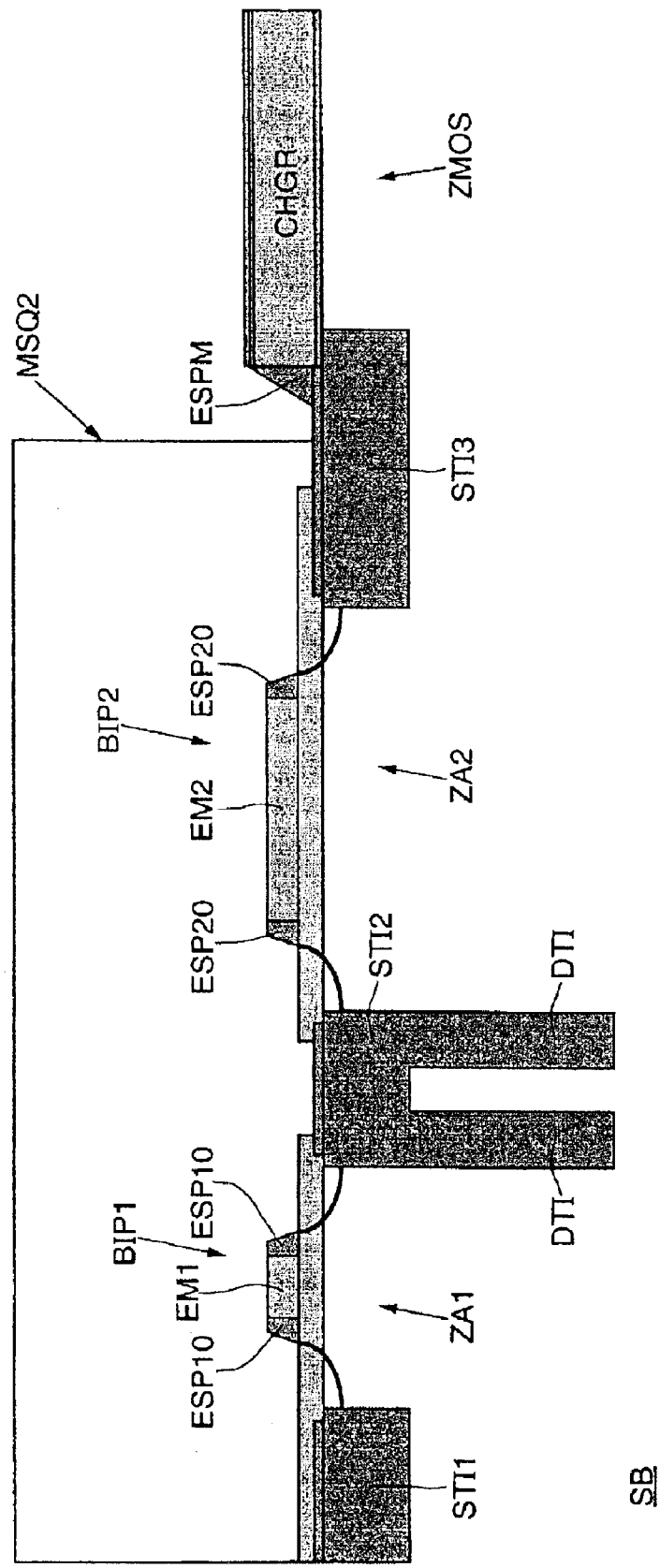

On reaching this stage of the process according to the invention, the bipolar transistors are virtually completed, apart from annealing and siliciding. A resin mask MSQ2 is then applied (FIG. 11) to protect the bipolar transistors BIP1 and BIP2 that have been produced (step 120, FIG. 12) and the MOS transistors are then produced (step 121).

This process continues in the conventional way with etching of the stack of isolating layers on top of the layer of gate material CHGR and then depositing a hard mask, for example a TEOS oxide mask, onto the layer CHGR. A lithography step defines the future location of the gates. The layer CHGR is etched accordingly, to produce the gates. The source and drain regions are then produced, in a conventional manner known to the person skilled in the art, for example by double implantation, before and after producing spacers flanking the gates of the MOS transistors.

Figure 12:
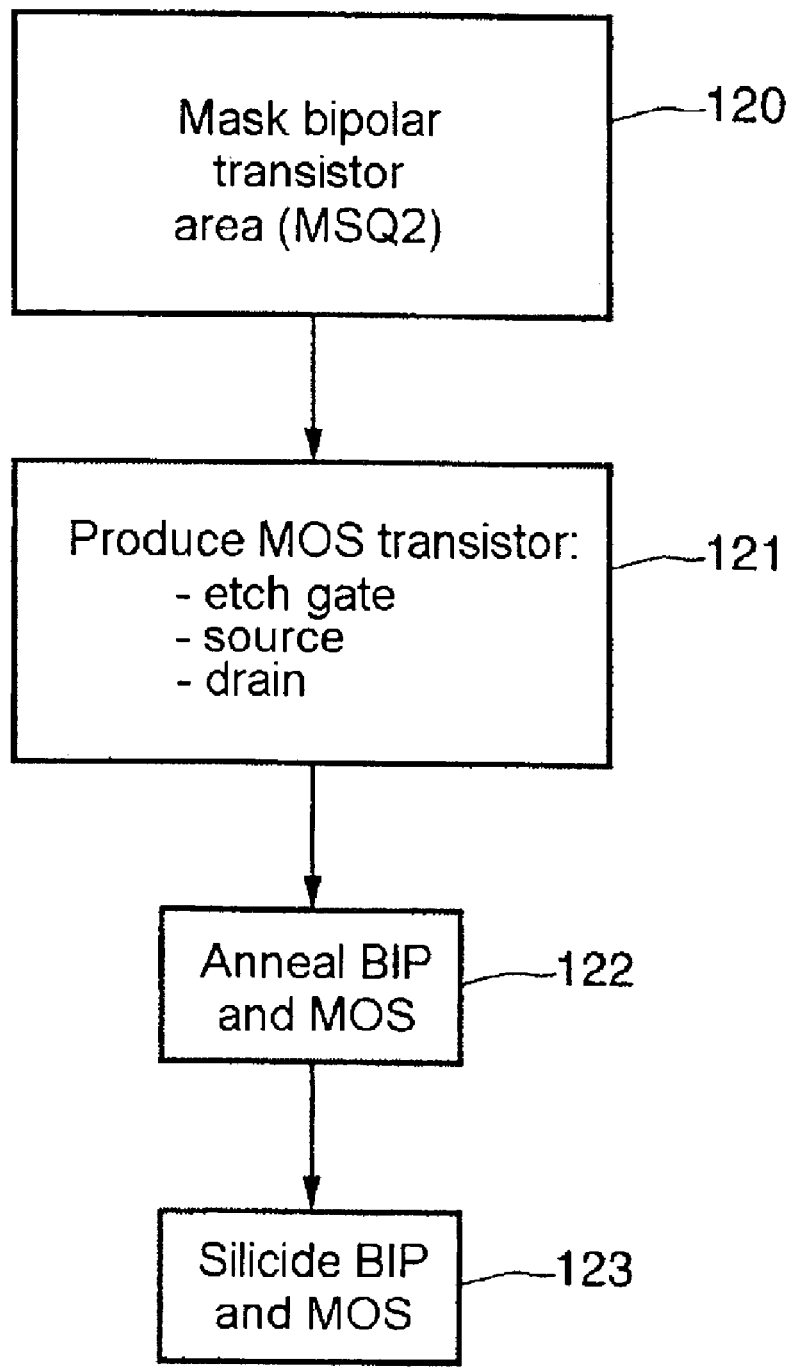

Then, after removing the resin mask MSQ2 (FIG. 11), common annealing of the bipolar and MOS transistors activates the dopants (step 122, FIG. 12).

The process then terminates with conventional siliciding 123 during which the bipolar transistors and the MOS transistors are silicided by forming a metal silicide, for example cobalt silicide, on the electrodes of the various transistors for subsequently producing contact terminals.

It must be noted here, in connection with the bipolar transistors, that this siliciding is also auto-aligned with the emitter window and with the extrinsic base because, once again, there is no intermediate lithography step between defining the emitter window, implanting the extrinsic base, and the siliciding.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A method of fabricating at least one bipolar transistor and at least one field-effect transistor within the same semiconductor bulk, comprising:

beginning, but not completing, production of the field-effect transistor;

then almost completely producing the bipolar transistor;

then returning to the production of the field-effect transistor; and then performing a finishing operation common to both the field-effect transistor and the bipolar transistor including a thermal annealing and siliciding of both transistors.

2. The method according to claim 1, wherein producing the bipolar transistor includes forming an intrinsic base and an extrinsic base comprising a heterojunction base which includes an agent for blocking diffusion of dopants during subsequent heat treatment.

3. The method according to claim 2, wherein producing the bipolar transistor includes defining a window of an emitter lithographically.

4. The method according to claim 3, wherein producing the bipolar transistor includes producing the emitter, the extrinsic base and silicidation areas of the bipolar transistor in such a manner that they are auto-aligned on the intrinsic base obtained by non-selective epitaxial growth.

5. The method according to claim 1, further including producing isolating areas in the semiconductor bulk, and:

wherein beginning comprises forming a gate material layer for the future field-effect transistor, gate implantation and annealing, and delimiting a bipolar transistor production area with etching of the gate material layer;

wherein almost completely producing comprises performing virtually all steps necessary to produce the bipolar transistor in the bipolar production area;

wherein returning comprises performing further production of the field-effect transistor; and wherein performing finishing step is performed next.

6. The method according to claim 5:

wherein performing virtually all includes producing an intrinsic base and an extrinsic base of the bipolar transistor and an emitter, and wherein performing further includes etching the gate material layer to define the gate of the field-effect transistor and forming source and drain regions.

7. The method according to claim 6, wherein producing the emitter includes forming a sacrificial emitter flanked by isolating spacers, inserting the sacrificial emitter flanked by isolating spacers into an isolating layer, removing the sacrificial emitter to produce a cavity, forming the emitter in the cavity, and removing the isolating layer.

8. The method according to claim 7, wherein the sacrificial emitter is formed on top of the intrinsic base of the bipolar transistor and in that a top surface of the sacrificial emitter extends higher than a top surface of a stack of layers in the field-effect transistor production area and including said gate material layer.

9. The method according to claim 8, wherein producing the emitter includes mechanochemical polishing with detection of interfaces between two different materials.

10. A method for fabricating a bipolar device and MOSFET device on a common substrate, comprising the steps of:

isolating a bipolar fabrication area from a MOSFET fabrication area;

forming MOSFET gate related structures in the MOSFET fabrication area;

then forming bipolar base and emitter structures in the bipolar fabrication area;

then forming source and drain related structures in the MOSFET fabrication area;

then performing a finishing step common to both the insulated-gate field-effect transistor and the bipolar transistor.

11. The method of claim 10 wherein the finishing step comprises thermal annealing and siliciding both the insulated-gate field-effect transistor and the bipolar transistor.

12. The method of claim 10 wherein the step of isolating comprises the step of forming shallow trench isolation structures between the bipolar fabrication area and the MOSFET fabrication area.

13. The method of claim 10 wherein the step of forming bipolar base structures comprises the step of forming an intrinsic base and an extrinsic base.

14. The method of claim 10 wherein the step of forming emitter structures comprises the step of forming a sacrificial emitter flanked by isolating spacers.

15. The method of claim 14 wherein the step of forming emitter structures further comprises the steps of removing the sacrificial emitter to define a cavity, and forming the emitter in the cavity.

16. The method of claim 14 wherein the sacrificial emitter is formed on top of the intrinsic base.

17. The method of claim 10 wherein the intrinsic and extrinsic base is a heterojunction base.

18. The method of claim 17 wherein the heterojunction base is a silicon-germanium base including carbon.

19. A method for fabricating a bipolar device and MOSFET device on a common substrate, comprising:

partially fabricating the structures of a MOSFET transistor in a MOSFET fabrication area of the common substrate without completing fabrication of MOSFET source and drain regions;

then substantially completely fabricating the structures of a bipolar transistor in a bipolar fabrication area of the common substrate;

then completing fabrication of the MOSFET transistor structures in the MOSFET fabrication area; and then applying a common thermal annealing and siliciding operation to both the MOSFET fabrication area and the bipolar fabrication area.

20. The method of claim 19 wherein partially fabricating comprises fabricating gate related structures without fabricating drain/source structures.

21. The method of claim 20 wherein completing fabrication comprises fabricating drain/source structures.

* * * * *

UNITED STATES PATENT AND TRADEMARK OFFICE
CERTIFICATE OF CORRECTION

PATENT NO. : 6,902,970 B2
DATED : June 7, 2005
INVENTOR(S) : Michel Marty et al.

It is certified that error appears in the above-identified patent and that said Letters Patent is hereby corrected as shown below:

Column 7,
Line 3, replace "wherein performing finishing step is performed next." to -- wherein performing finishing is performed next. --.

Signed and Sealed this

Twenty-ninth Day of November, 2005

JON W. DUDAS
*Director of the United States Patent and Trademark Office*